United States Patent [19]

Hoffman

[11] 4,449,205

[45] May 15, 1984

[54] DYNAMIC RAM WITH NON-VOLATILE BACK-UP STORAGE AND METHOD OF OPERATION THEREOF

[75] Inventor: Charles R. Hoffman, Raleigh, N.C.

[73] Assignee: International Business Machines Corp., Armonk, N.Y.

[21] Appl. No.: 350,479

[22] Filed: Feb. 19, 1982

[51] Int. Cl.³ .............................................. G11C 11/40
[52] U.S. Cl. ................................... 365/182; 365/200; 365/218; 365/229; 371/10
[58] Field of Search ....................... 365/182, 200, 218; 371/10, 14

[56] References Cited

U.S. PATENT DOCUMENTS 4,055,837 10/1977 Stein et al. ........................... 340/173

OTHER PUBLICATIONS

Devices, vol. ED-28, No. 9, Sep. 1981, Electrically Erasable Memory Behaves Like a Fast, Nonvolatile RAM, C. Wallace, Electronics, May 10, 1979.
64-K Dynamic RAM Needs Only One 5-Volt Supply to Outstrip 16-K Parts, by Rao et al., Electronics, Sep. 28, 1978.
5-Volt-Only, Nonvolatile RAM Owes it all to Polysilicon, by Klein et al., Electronics, Oct. 11, 1979.
Dual-Electron-Injector-Structure Electrically Alterable Read-Only-Memory Modeling Studies, Kristin et al., IEEE Trans. on Elec.

*Primary Examiner*—Terrell W. Fears
*Attorney, Agent, or Firm*—Edward H. Duffield

[57] ABSTRACT

A dynamic random access memory having a non-volatile back-up storage capability including a latent image capability, and method of operating the memory. Each memory cell is composed of a dynamic portion and a non-volatile portion connected to the dynamic portion. The non-volatile portion is formed of a dual gate FET, one gate of which is a floating gate. A segment of DEIS (Dual Electron Injection Structure) material is provided to control the charge of the floating gate. A capacitor couples the floating gate to the source of the dual gate FET and to the data node of the cell. The second gate of the dual gate FET can be grounded to turn off the channel of the dual gate FET independent of the charge on the floating gate during normal dynamic memory operations. To perform a non-volatile storing operation, the voltage applied to the DEIS material opposite the floating gate is taken first positive and then negative. During the positive portion of the cycle, if the data at the data node is a data 0, a positive charge is stored on the floating gate, while if the data at the data node is a data 0, a positive charge is stored on the floating gate during the negative portion of the cycle. To restore the data, a data 1 is written at the data node and the second gate of the dual gate FET transistor is pulsed to thereby allow the charge stored on the floating gate to control the conductivity of the channel of the dual gate FET. If a positive charge is stored on the floating gate, the channel conducts and discharges the data node, while if a negative charge is stored on the floating gate, the channel remains non-conductive and the charge at the data node is retained.

14 Claims, 15 Drawing Figures

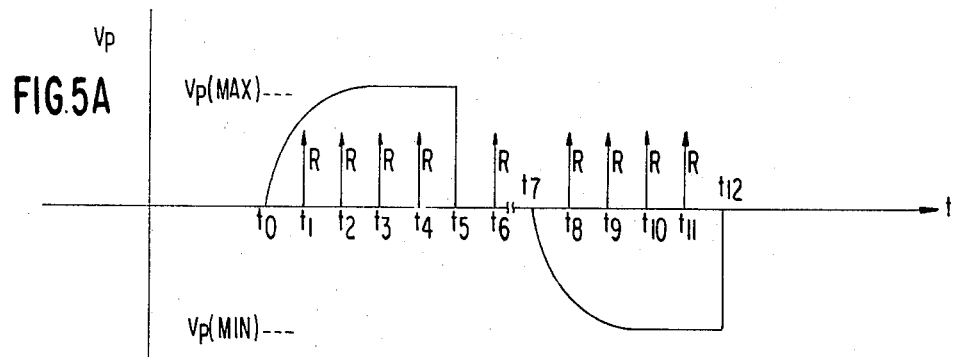
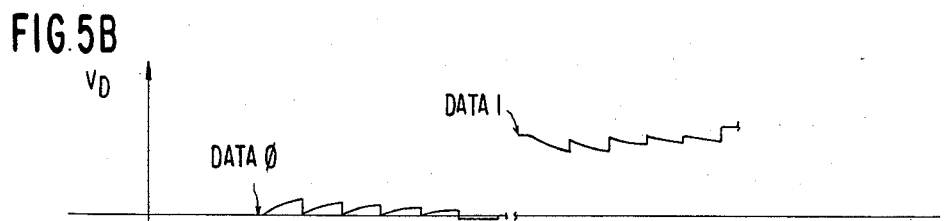
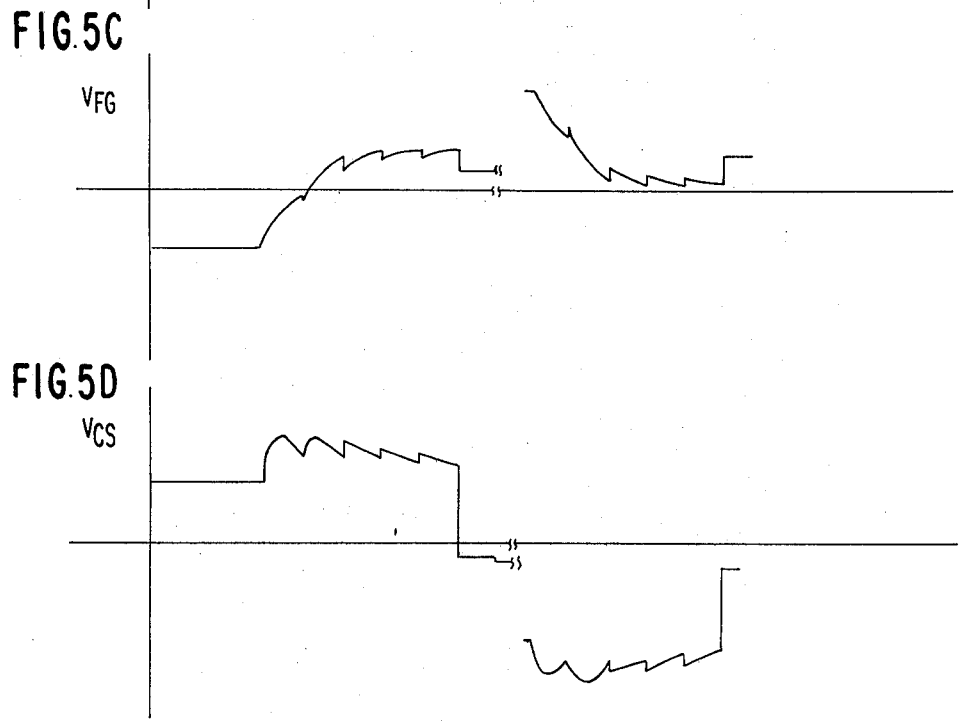

DYNAMIC RAM WITH NON-VOLATILE BACK-UP STORAGE AND METHOD OF OPERATION THEREOF

BACKGROUND OF THE INVENTION

The invention pertains to an MOS memory device. More specifically, the invention pertains to a dynamic-type MOS RAM (Random Access Memory) which has a non-volatile back-up storage capability.

A great deal of research activity has recently been conducted to develop a non-volatile random access memory on a single silicon chip. Prior to the availability of non-volatile random access memories fabricated on a single silicon chip, the most common way of achieving non-volatility was to provide a battery backup for the MOS memory. When a main power supply failed, the battery was automatically switched in to power the device until the main power source could be brought back on-line. This arrangement was generally not satisfactory because the battery was expensive, the battery required periodic maintenance and replacement and, if the battery failed, the data stored in the memory was disastrously lost. For these reasons, it is desirable to provide a non-volatile random access memory which does not require a battery back-up.

A non-volatile memory device fabricated on a single silicon chip is disclosed in "Dual-Electron Injector-Structure Electrically Alterable Read-Only Memory Model Studies," DiMaria et al., *IEEE Transactions on Electron Devices,* Vol. ED-28, No. 9, September 1981, and in copending patent application Ser. No. 124,003, filed Feb. 26, 1980, which is assigned in common with the present application. This memory device uses a cell structure composed of an n-channel MOS transistor with DEIS (Dual Electron Injector Stack) material positioned between a control gate and a "floating" polycrystalline silicon gate. Writing is performed by applying a negative voltage to the control gate. This negative voltage causes the injection of electrons from the top silicon-rich $SiO_2$ injector layer of the DEIS material to the floating polysilicon layer. Similarly, erasing is performed by applying a positive voltage to the control gate, which then injects electrons from a bottom silicon-rich $SiO_2$ injector layer of the DEIS material to the floating polysilicon layer.

As shown in FIG. 4A, the DEIS material is formed by a layer 42 of insulating $SiO_2$ sandwiched between two silicon-rich $SiO_2$ injector layers 41 and 43. Polysilicon layers are located immediately outside the silicon-rich $SiO_2$ injector layers, the lower one of which forms the floating gate electrode and the upper one of which is connected to a gate line. The log $I - V_{CS}$ characteristic of this material is shown in FIG. 4B. When a positive voltage $V_{CS}$ of sufficient magnitude is applied, the current through the material is $I = I_{OP}e^{K_P V_{CS}}$, while when a negative voltage $V_{CS}$ of sufficient magnitude is applied across the device, a negative current $I = I_{ON}e^{K_N V_{CS}}$ will flow, where $I_{OP}$, $I_{ON}$, $K_P$ and $K_N$ are constants. Otherwise, when the magnitude of the voltage $V_{CS}$ is sufficiently low, substantially no current will flow through the material.

While the memory device of the DiMaria et al. publication does in fact provide non-volatile storage capability and is quite useful in a number of applications, it is still not acceptable for many applications in which random access memories have customarily been employed. The reasons are that the relatively long reading and writing times are required to get data in and out of the memory cells. Moreover, there is a serious drawback in that only a limited number (for instance, 10,000) reading and writing operations can be performed in a cell of this type.

To achieve higher normal operating speeds while retaining a non-volatile memory capability, several proposals have been made to pair non-volatile backup storage cells with faster storage cells which do not have the non-volatile storage capability. During normal continuous operations, the memory operates using the volatile cells. If the power supply fails, back-up power is supplied for a relatively short period of time from a storage source such as a capacitor bank. As soon as the main power supply fails, data from the volatile cells is transferred to their paired non-volatile cells using the power from the back-up power source. When the normal power source is back on-line, a data transfer operation is made from the non-volatile cells back to the volatile cells, and then normal memory operation is continued. Examples of memories of this type are described in the articles "Five Volt Only Non-Volatile RAM Owes It All To Polysilicon," *Electronics,* Oct. 11, 1979, p 111, "Completely Electrically Erasible Memory Behaves Like A fast, Non-Volatile RAM," *Electronics,* May 10, 1979, p. 128 and co-pending U.S. patent application Ser. Nos. 192,579 and 192,580 filed Sept. 30, 1980 and assigned in common herewith.

Although the devices of these proposals do provide an increased minimum operating speed together with non-volatile storage for use during times of power failure, the density of the memory cells is not attractive on a cost/performance basis compared to a battery powered volatile random access memory arrangement. This is in large part due to the use of static-type memory cells for the volatile cells of the memory. As is well known, static MOS memory cells use a two-transistor flip-flop arrangement requiring a relatively large amount of chip surface area per cell.

In many applications, it is preferable to provide a random access memory utilizing dynamic cells. The reason for this is that much higher cell densities are obtainable, although at the cost of having to periodically refresh the cells. A memory of this type is described in the article "64-K Dynamic RAM Needs Only One 5-Volt Supply to Outstrip 16-K Parts," *Electronics,* Sept. 28, 1978. Each memory cell in this random access memory device requires only a single MOS transistor and storage capacitor. However, the memory described in this article has no non-volatile data capability.

U.S. Pat. No. 4,055,837, issued Oct. 25, 1977 to Stein et al., describes a dynamic single transistor memory element which provides for relative-permanent storage. The memory cell of the memory array is composed of an MOS transistor having a gate coupled to a word line and a source and drain coupled in series with a metal dielectric semiconductor capacitor between a write line and a bit line. This arrangement suffers from a drawback in that, to recommence normal operations following restoration of power, it is necessary to perform a restore operation. This restore operation erases the data from non-volatile storage. Thus, the device has no latent storage capability. That is, the device is not capable of retaining a primary set of data in its nonvolatile storage cells after a restore operation has been performed.

A further example of a dynamic memory having a non-volatile storage capability but with no latent image capability is disclosed in commonly-assigned U.S. Pat. application Ser. No, 219,285, filed Dec. 22, 1980.

Thus, it is a primary object of the present invention to provide a high speed MOS memory device having non-volatile backup storage capability.

Further, it is an object of the present invention to provide such a memory device in which, in addition to the non-volatile storage capability, a latent storage capability is also provided.

It is yet a further object of the present invention to provide such a memory device having a very small cell size and simple and construction.

It is also an object of the present invention to provide a method of operating such a memory device.

SUMMARY OF THE INVENTION

In accordance with these and other objects of the invention, there is provided a memory array composed of a number of dynamic non-volatile memory cells. Each memory cell includes a volatile dynamic memory element composed of a first FET having a source coupled to a bit line and a gate coupled to a word line. The drain of the first FET is coupled to a data node with a drain voltage source being coupled through a data storage capacitor to the data node. A non-volatile memory element is also connected to the data node. The non-volatile memory element is composed of a dual gate second FET having a floating gate element and a separate control gate element. The potential of the floating gate element is controlled by current flowing through a DEIS insulator layer of the type described in the above-mentioned article by DiMaria et al. The floating gate is insulated from the channel of the second FET by a gate oxide layer with the DEIS material disposed above the floating gate. The second control gate, which is insulated from the channel by the gate oxide layer, is supplied with a source of control voltage to turn the channel of the second FET off regardless of the amount of charge stored on or the potential of the floating gate.

Further in accordance with the invention, there is provided a method for operating such a memory cell. To transfer data from the volatile dynamic element to the non-volatile cell, the floating gate is driven first positive and then negative. In the positive state, a positive charge is stored on the floating gate if the data at the data node is a data O. Otherwise, during the negative state, a negative charge is stored on the floating gate if the data of the data node is a data 1. In either case, the potential of the floating gate is changed by current flowing through the DEIS material layer. To recover data stored on the floating gate, that is, to transfer the data stored on the floating gate in the non-volatile element of a memory cell to the dynamic portion of the cell, the data node of the dynamic cell is first forced to a data 1 state. Then, the second control gate of the dual gate FET is taken to a positive level. The floating gate, if it is then charged with a positive charge, will, in cooperation with the positive level on the second control gate, turn on the channel of the dual gate FET, and hence the charge on the data storage capacitor is discharged through the dual gate FET to ground. If the floating gate is charged negatively, the channel region under the floating gate of the second FET will be off so that the data storage capacitor is not discharged, and hence the data node will remain at the data 1 level. The second control gate voltage is then returned to ground to allow normal operations to commence.

BRIEF DESCRIPTION OF THE DRAWINGS

FIGS. 5A–5D are a series of graphs illustrating a transfer operation between the dynamic and non-volatile portions of the memory cell of FIGS. 2A and 2B;

DESCRIPTION OF THE PREFERRED EMBODIMENTS

Figure 1A:
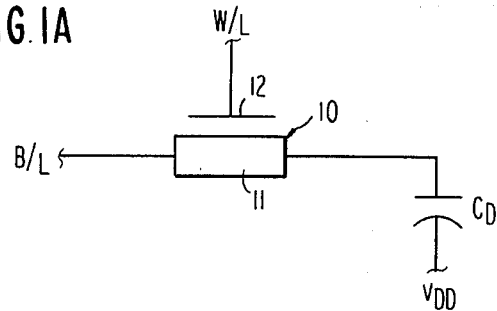
FIG. 1A is a schematic circuit representation of a dynamic portion of a memory cell of the invention.

Referring now to FIG. 1A, there is shown therein a schematic representation of the dynamic portion of a memory cell of the invention. The dynamic element or portion of the memory cell is composed basically of a first FET transistor 10 and a data storage capacitor $C_D$. The source of the transistor 10 is connected to a bit line B/L, the gate 12 to a word line W/L, and the drain to one side of the capacitor $C_D$. The other side of the capacitor $C_D$ is coupled to a pulsed drain voltage source $V_{DD}$.

Figure 1B:
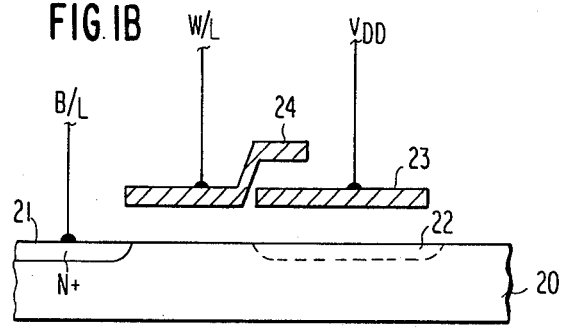
FIG. 1B is a cross-sectional view of a memory cell of the invention showing the structure therein corresponding to the circuit of FIG. 1A.

FIG. 1B is a cross-sectional view showing the physical construction of the portion of the memory cell shown in FIG. 1A. This dynamic element of the cell is fabricated upon a substrate 20, which is of the P type. An N+ source region 21 is formed at the left side of the cell. The gate is formed by a polysilicon layer 24 which lies above the center part of the transistor. To form the capacitor $C_D$, an implanted region is formed under a polysilicon layer 23.

In actual practice, the polysilicon layers 23 and 24 and the intervening space between them and the surface of the substrate 20 would be covered by insulating oxide. However, for purposes of clarity, the insulating oxide has been omitted from the view of FIG. 1B.

To store data in the cell, the word line W/L is taken to a positive voltage. Then, the capacitor $C_D$ is charged either with a positive voltage (the drain-connected side of the capacitor $C_D$ being positive with respect to the side thereof connected to $V_{DD}$) to store a data 1, or, with the word line W/L in the positive state, the bit line B/L and the drain voltage $V_{DD}$ are connected to the same potential to thereby discharge the capacitor $C_D$ and hence to store a zero charge representing a data 0.

Figure 3:
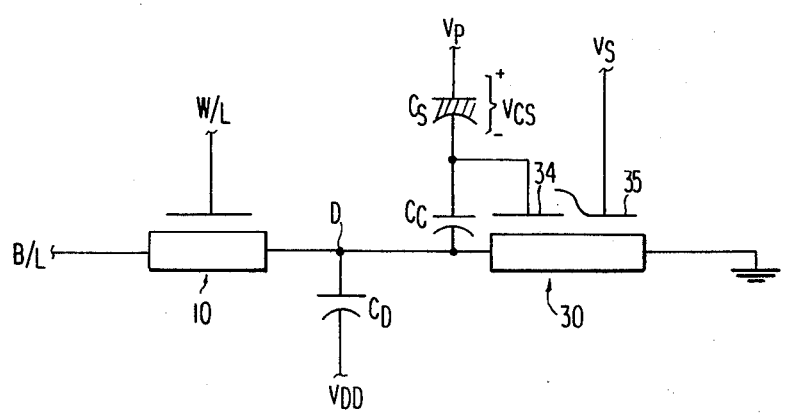
FIG. 3 is a schematic view of the memory cell shown in FIGS. 2A and 2B.

A schematic representation of the entire memory cell of the invention is shown in FIG. 3. As shown therein, the dynamic portion of the cell is the same as that of FIG. 1A. The non-volatile portion of the cell is connected to the data node D. In the non-volatile element or portion, a second FET transistor 30 has a source electrode connected to the data node D, and a drain electrode connected to ground. The second FET 30 has a dual gate structure including first and second gates 34 and 35. The first gate 34 is connected to one side of a capacitor $C_C$, which is formed utilizing an ordinary dielectric material. The other side of the capacitor $C_C$ is connected to the data node D. The first gate 34 is also connected to one side of a second capacitor $C_S$, the other side of which is connected to a source of a pulsed voltage $V_P$. The second gate 35 is connected directly to a source of a pulsed voltage $V_S$.

Figures 2A, 2B:
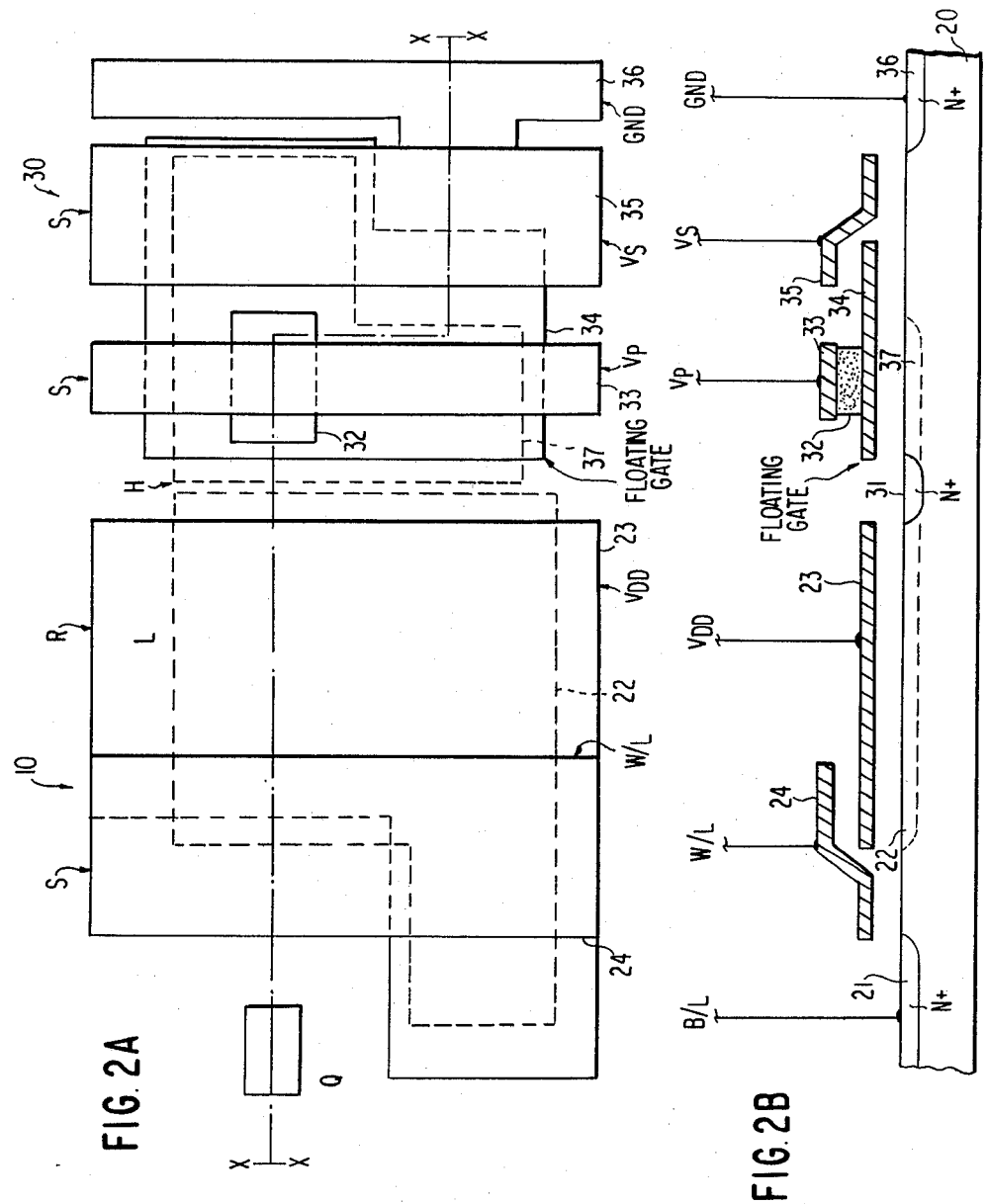
FIG. 2A is a top view and FIG. 2B is a cross-sectional view of a memory cell of the invention.
Figure 4A:
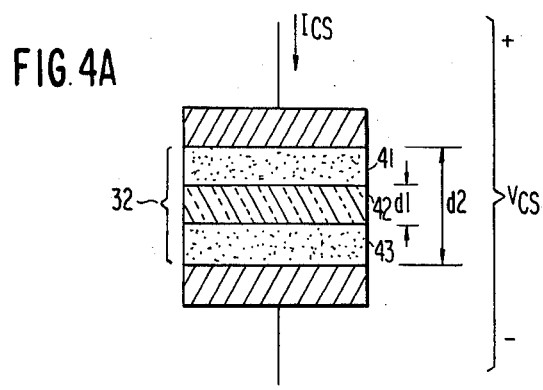
FIG. 4A shows a cross-sectional view of DEIS material as utilized in the memory cell FIGS. 2A and 2B.
Figure 4B:
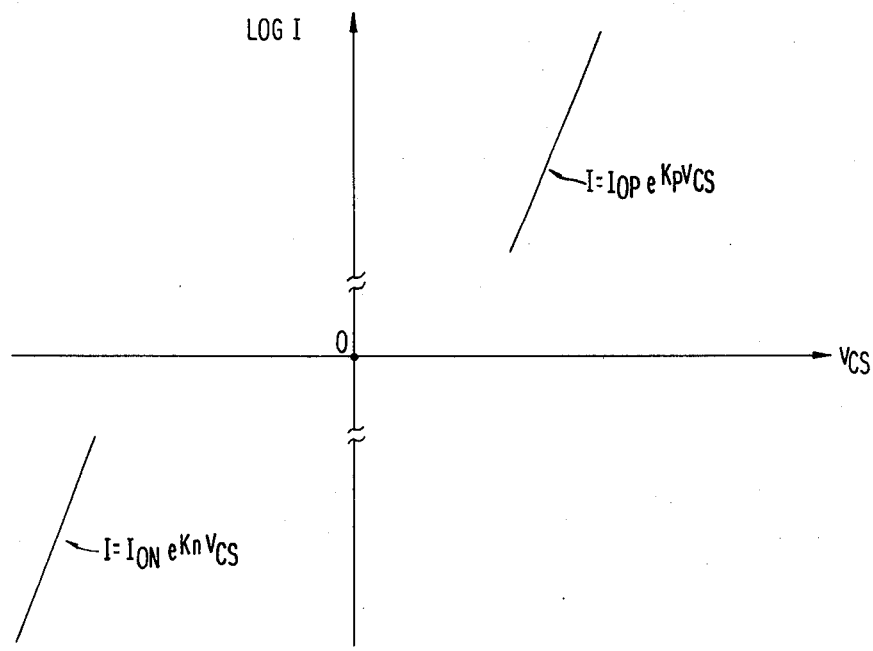
FIG. 4B is a graph showing electrical characteristics of the DEIS material of FIG. 4A.
Figure 6:
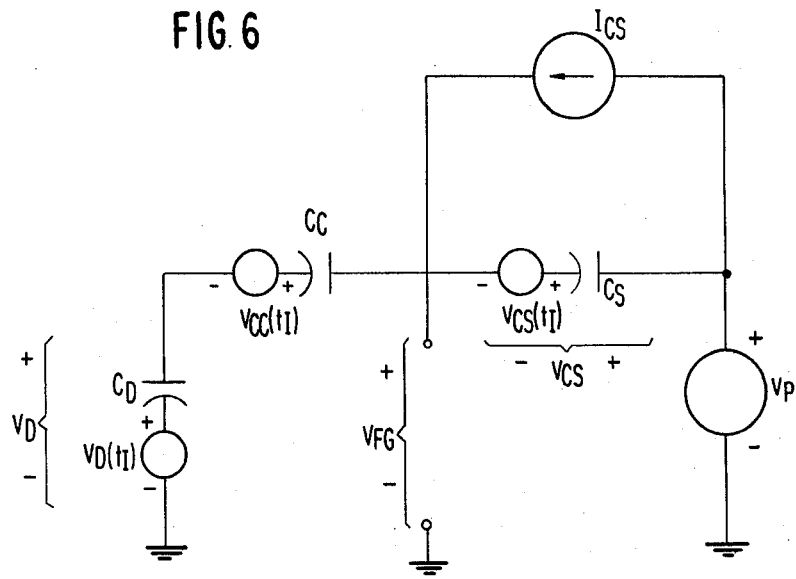
FIG. 6 is an equivalent circuit diagram of the circuit of FIG. 3 during a non-volatile storing operation.

The physical structure of the cell shown shematically in FIG. 3 is seen in the top view of FIG. 2A and the corresponding cross-sectional view of FIG. 2B. The structure of the dynamic portion of this cell is the same as that shown in FIG. 1B except that the implant region 22 extends to an N+ diffusion 31 which corresponds to the Data node D in the schematic representations of the cell. A second implant region 37 is formed in the non-volatile portion of the cell below a polysilicon layer 34. A segment of DEIS material 32 is formed between the polysilicon layers 33 and 34. The second gate 35 is formed as a two-level structure having a first portion in the same plane as the polysilicon layer 34 and a second portion in the plane of the polysilicon layer 33. The drain of the second FET transistor 30 is connected to a grounded N+ diffusion 36.

As may be seen most clearly in the top view of FIG. 2A, the cross-sectional area of the DEIS material segment 32 is much smaller than the area of the polysilicon layer 34. As the capacitor $C_C$ is formed between the polysilicon layer 34 and the implant region 37 and the capacitor $C_S$ is formed between the polysilicon layer 33 and polysilicon layer 34 through the segment 32 of DEIS material, the capacitance value of the capacitor $C_S$ is substantially less than that of the capacitor $C_C$. The floating gate of the non-volatile portion of the cell of course corresponds to the polysilicon layer 34.

Preferably, the geometric areas of the various layers are chosen so that the relationship $C_D = 2C_C = 10C_S$ is approximately maintained when the capacitor $C_S$ is in its conductive mode, that is, when the segment 32 of the DEIS material is being stressed with the applied voltage to the point that the current flows through the capacitor $C_S$. When the voltage impressed across the capacitor $C_S$ is not sufficiently high to cause conduction thereof, the capacitance of the capacitor $C_S$ will be two to three times smaller than that in the conductive state.

It is to be noted that the various polysilicon layers, the surface of the substrate 20, and the segment 32 of DEIS material are to be covered with insulating oxide, the insulating oxide being omitted in FIGS. 2A and 2B for purposes of clarity. It is believed clear to those of ordinary skill in the art that the device shown in FIGS. 2A and 2B can be fabricated utilizing well-known semiconductor processing techniques.

To operate the cell of FIGS. 2A, 2B and 3 in a normal read/write mode, that is, without the use of non-volatile storage, $V_S$ and $V_P$ are held at ground potential, and the word line W/L and the bit line B/L are operated as in a normal dynamic random access memory. In this mode, the charge on the floating first gate 34 has substantially no effect upon the operation of the dynamic portion of the cell. This is due to the fact that, although the capacitors $C_C$ and $C_S$ are in effect connected in the circuit at the data node D and although the capacitor $C_C$ is relatively large, because they are connected in series and the capacitor $C_S$ is very small, the additional capacitive load imposed upon the data node D is very small.

When a non-volatile storage operation is to be conducted, $V_P$ is pulsed first positive and then negative. During the positive portion of the pulse, if the data node D is at the data 0 level (corresponding to a zero charge stored on the capacitor $C_D$), a large positive voltage drop will appear across the capacitor $C_S$ thereby resulting in a current flow through the DEIS material of the capacitor $C_S$ which in turn enhances the positive charge on the floating first gate 34. During the subsequent negative pulse, for a data 0 at the data node D, there will be substantially no effect upon the charge on the floating gate 34. For a data 1 at the data node D, there will be substantially no effect on the charge on the first floating gate 34 during the positive pulse. However, during the negative pulse, a data 1 at the data node D will result in a large negative voltage drop across the capacitor $C_S$, thereby resulting in a current flow through the DEIS insulator material of the capacitor $C_S$ and hence a negative charge on the floating first gate 34. The reason why the potential on the floating first gate 34 is substantially unaffected for combinations of a data 1 at the data node D for the positive pulse and a data 0 at the data note D for the negative pulse is that the resulting voltage across the capacitor $C_S$ in those conditions is too small to cause conduction in the DEIS material.

To recover the data stored in the non-volatile portion of the cell, such as during a power-up operation, $V_P$ is held at ground and a data 1 is written into the dynamic portion of the cell by positively charging the capacitor $C_D$ using a normal storage operation. Following this, $V_S$ is taken to a positive voltage to thereby turn on the channel of the second FET 30 if the floating gate also is positive. If the floating first gate 34 has been charged with a positive charge (corresponding to a data 0), the channel region of the second FET transitor 30 under the first gate 34 will be turned on and the capacitor $C_D$ will be discharged. On the other hand, if the floating first gate 34 is charged negatively (corresponding to a data 1), the channel region of the second FET transistor 30 under the first gate 34 will be off and the capacitor $C_D$ will retain its positive charge. Following the data recovery operation, $V_S$ is taken to ground and normal operation of the random access memory can then commence.

It may be noted at this point that the charge on the floating gate is not lost during data recovery. Thus, the device is provided with a latent storage or image capability. Viewed another way, the device can be operated both as a read only memory and a random access memory. For instance, an initializing set of data can be stored in the non-volatile portion of the cell for use at the commencement of some particular operation. After the initial use of this data, the device can then be operated simply as a normal random access memory. When it is again desired to initialize the operation, the same initial data can be transferred from the non-volatile portion of the cells to the dynamic memory.

During the time that the floating gate is being charged to perform a non-volatile storage operation, the word line W/L will be at zero volts and, thus the capacitors $C_D$, $C_C$ and $C_S$ will be isolated from the bit line B/L and ground. Therefore, as the floating gate charges, the voltage at the node D will also change. To provide the necessary amount of voltage drop or voltage stressing across the capacitor $C_S$, it is necessary to periodically refresh the charge of the capacitor $C_D$ during the non-volatile storage operation. In order to correctly refresh the charge of the capacitor $C_D$, the voltage excursions at the node D must be bounded during the non-volatile storage operation. The refresh operation to be performed with the cell will be discussed in further detail below with reference to the waveforms of FIGS. 5A through 5D.

The waveform of $V_P$ is shown in FIG. 5A. In FIG. 5A, the arrows R indicate refresh times of the capacitor $C_D$. $V_P$ starts from zero volts at time $t_0$ then rises with a controlled slope to attain its maximum value at about time $t_3$. After the positive pulse is completed at time $t_5$, $V_P$ is returned to zero. Then, at time $t_7$, $V_P$ drops with a controlled slope to its minimum value then returns to zero at time $t_{12}$. The controlled rate of rise and fall of $V_P$ at the beginning of the positive and negative pulses is to prevent sudden discharge of the capacitor $C_D$. If $V_P$ were stepwise changed, the voltage across the capacitor $V_D$ may fall below the level at which a refresh operation can successfully be performed. By controlling the slope of $V_P$ at the beginning of the positive and negative pulses, it is insured that the voltage across the capacitor $C_D$ will remain within the limits where the refresh operation of the capacitor $C_D$ can successfully be performed. The voltage $V_D$ across the capacitor $C_D$ is shown in FIG. 5B for a data 0 and a data 1. The voltage $V_{FG}$ on the floating first gate 34 during this operation is shown in FIG. 5C for both a data 0 and a data 1, corresponding to the case illustrated in FIG. 5B. The corresponding voltage $V_{CS}$ across the capacitor $C_S$ is shown in FIG. 5D.

A mathematical analysis of the voltages at critical points in the circuit of FIG. 3 during the refresh operation will now be given.

Voltage changes in $V_P$ are reflected at the floating first gate 34 and at the data node D in accordance with the following relationships:

$$\Delta V_{FG}|V_P = \frac{C_S}{C_{CD} + C_S} \cdot \Delta V_P \; C_{CD} = \frac{C_C \cdot C_D}{C_C + C_D}$$

$$\Delta V_D|V_P = \frac{C_{CS}}{C_{CS} + C_D} \cdot \Delta V_P \; C_{CS} = \frac{C_C \cdot C_S}{C_C + C_S}$$

The potential of these nodes will also change due to the current $I_{CS}$ charging the total capacitance seen at the floating first gate 34. The current $I_{CS}$ is an exponential function of the voltage across the capacitor $C_S$, and therefore changes as the capacitor voltage changes. Using known circuit analysis techniques, it can be shown that:

$$\Delta V_{FG}|I_{CS} = V_{CS}(t_I) + \frac{1}{K} \ln\left[\frac{t_F - t_I}{t_K}\right],$$

where:
$V_{CS}(t_I)$ = voltage across $C_S$ at the start of the charging interval,
$K = K_P$ or $K_N$ depending upon the polarity of $V_{CS}$,
$(t_F - t_I)$ = floating gate charging interval, $$t_K = \frac{C_T}{I_{OP}K_P} \text{ or } \frac{C_T}{I_{ON}K_N} \text{ and } C_T = C_S + \frac{C_{CD}}{C_C + C_D}$$

A study of this equation shows that the initial voltage on the capacitor $C_S$ is the dominant factor in determining how much the floating gate voltage will change for a given time interval. Note also that as the potential of the floating gate changes, the node D voltage also changes in an amount:

$$\Delta V_D|I_{CS} = \frac{C_C}{C_D + C_C} \cdot \Delta V_{FG}I_{CS}$$

In order to successfully refresh the data stored in the capacitor $C_D$, $\Delta V_D$ must be restricted such that its maximum excursion does not take it beyond the point where the refresh circuit can detect the correct logic state.

The dominant factors that lead to the voltage change at node D are:
 a. the initial voltage on the capacitor $C_S$,
 b. relative capacitor sizes, and
 c. time between refresh intervals.

Figure 7:
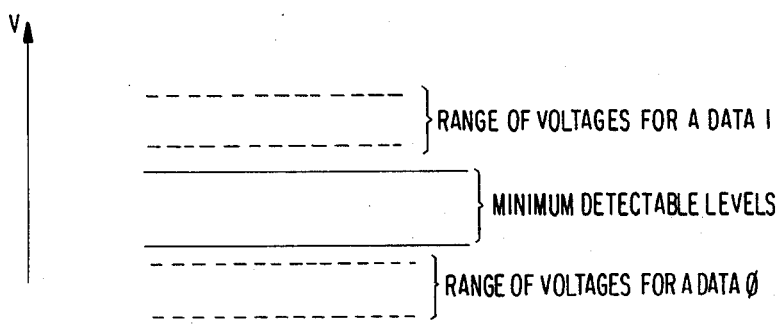
FIG. 7 is a voltage level diagram for a data node D of the circuit of FIG. 3.

A representation of the relative allowable voltage ranges at the data node D is shown in the diagram of FIG. 7.

Figure 8:
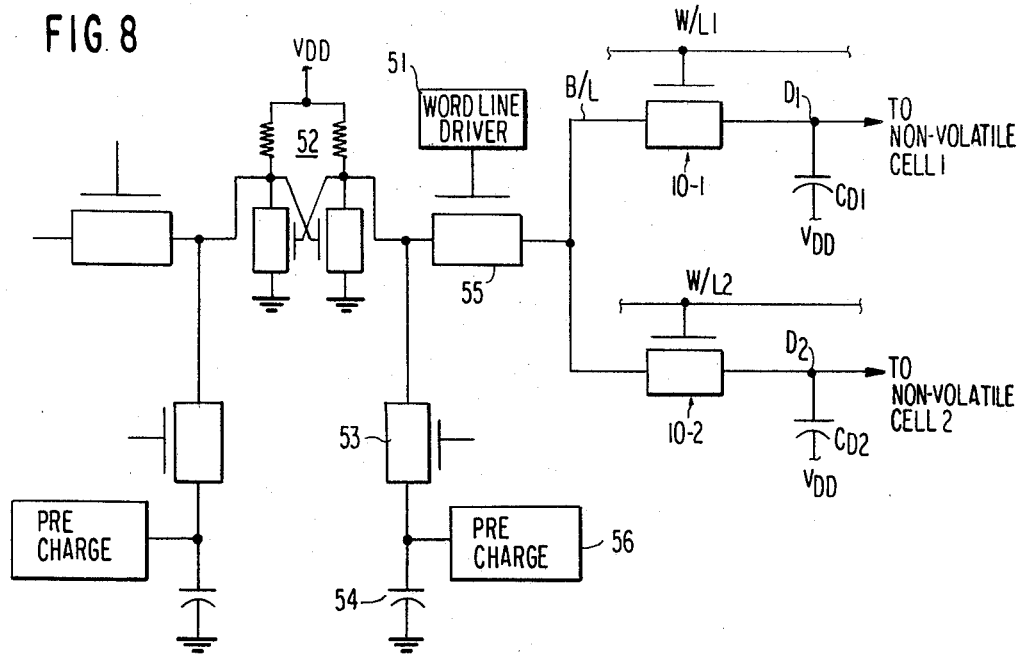
FIG. 8 is a circuit diagram showing refresh circuitry utilized with the memory circuit shown in FIGS. 2A and 2B.

A circuit which is used for refreshing the cell, both during normal random access memory operations and during non-volatile storing operations, is shown in the circuit diagram of FIG. 8. It may be noted that this is a standard type of refresh circuit and a brief description thereof is given herein only for convenience.

The bit line B/L which interconnects various ones of the cells is connected through an FET 55 to a flip-flop circuit 52. In the view of FIG. 8, two cells and two first transistors 10-1 and 10-2 are shown, although in a practical memory, many more cells would be provided. To perfrom a refresh operation, the flip-flop circuit 52 is set in a quiescent state halfway between data 0 and data 1 levels. The word line driver 51 actuates the transistor 55 at each refresh interval. At each refresh interval, one of the word lines $W/L_1$, $W/L_2$, . . . is also activated, thus coupling one of the transistors 10-1, 10-2 . . . and hence one of the capacitors $C_{D1}$, $C_{D2}$, . . . to the flip-flop circuit 52. Depending upon the state of the charge on the capacitor $C_D$ of the activated cell, the flip-flop circuit 52 will be set to one state or the other. Because the transistors of the flip-flop circuit 52 are relatively quite large, when the flip-flop circuit 52 is set in one of the definite logic states, it pulls the voltage of the connected capacitor $C_D$ with it, thereby refreshing the voltage across the capacitor $C_D$. A pre-charge circuit 56 is utilized for setting the flip-flop circuit 52 in the quiescent state.

As mentioned above, the circuit of FIG. 8 is given only by way of example as other refresh techniques may be utilized. For instance, one can refer to the above referenced article by Rau et al. and "Peripheral Circuits One-Transistor Cell MOS RAM's, Foss et al., *IEEE Journal of Solid State Circuits,*" Vol. SC-10, No. 5, October 1975, pp. 255–261, for a further discussion of available refresh circuits and techniques.

Figure 9:
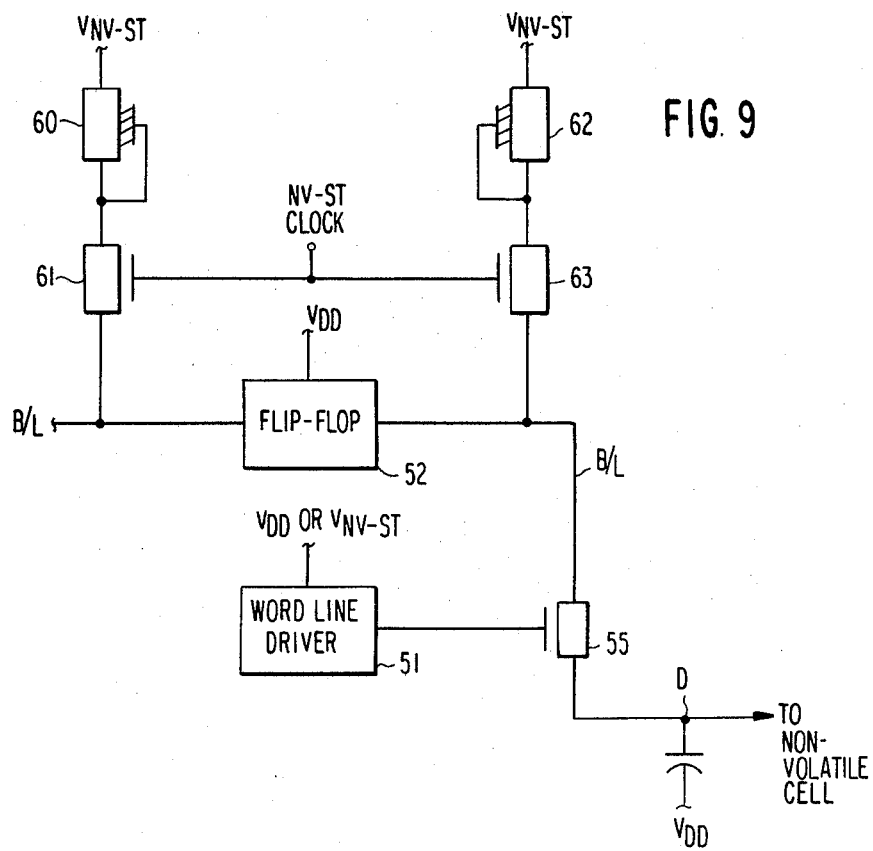
FIG. 9 is a circuit diagram for an enhanced signal embodiment.

In some instances, during non-volatile storage operations, it may be desirable to generate larger signal swings at the data node D than the normal read write signals would permit. A circuit for achieving this is shown in FIG. 9. In this circuit, transistors 60 through 63 have been added to the flip-flop circuit 52. A clock signal is applied to the gates of the transistors 61 and 63. During normal random access memory operations, the clock is in the off state and the word line driver 51 is powered by the normal $V_{DD}$ level. During non-volatile storage operations, the word line driver 51 is powered by a voltage level $V_{NV-ST}$ to enable the data node D to be charged to the full bit line high voltage level. The bit line B/L is taken to its high level by bringing the clock signal to the high state after the flip-flop circuit 52 has sensed the state at the data node D and refreshed the data node D to its normal $V_{DD}$ level. Thus, the clock signal is utilized to charge the data node D from $V_{DD}$ to $V_{NV-ST}$.

This completes the description of the preferred embodiments of the invention. Although preferred embodiments have been described, it is believed that numerous alterations and modifications thereto would be apparent to one having ordinary skill in the art without departing from the spirit and scope of the invention.

I claim:

1. A semiconductor memory device having a plurality of memory cells, each of said cells comprising:
dynamic memory means; and
non-volatile memory means coupled to said dynamic memory means for storing a data bit from said dynamic memory means in a non-volatile manner and transferring data to said dynamic memory means without loss of data in said non-volatile memory means' said non-volatile memory element means comprising a floating gate memory element comprising a dual gate FET, one gate of said dual gate FET being a floating gate having a state of charge thereof controlled through a DEIS insulator structure for programming and erasing charge on said floating gate.

2. The memory device of claim 1 wherein said dynamic memory means comprises a first FET having a source electrode connected to a bit line of said memory device, a drain connected to a data node of the cell, and a gate connected to a word line of said memory device; and a first capacitor coupled between said data node and a pulsed voltage source.

3. A semiconductor memory device having a plurality of memory cells, each of said memory cells comprising:
an FET dynamic memory unit, said FET dynamic memory unit including a first FET having a source coupled to a bit line of said memory device, a drain coupled to a data node of the cell and a gate coupled to a word line of said memory device, and a first capacitor coupled between said data node and a first pulsed voltage source; and
a non-volatile memory unit coupled to said dynamic memory unit for storing data from said dynamic memory unit and transferring data to said dynamic memory unit in a non-volatile manner, said non-volatile memory cell comprising a dual gate second FET having a source coupled to said data node, and a first gate comprising a floating gate, a second capacitor coupled between said floating gate and said data node, a third capacitor coupled between said floating gate and a second pulsed voltage source with a dielectric material of said second capacitor comprising DEIS material, and a second gate coupled to a third pulsed voltage source.

4. The memory device of claim 3 wherein the capacitance of said third capacitor is substantially less than that of said second capacitor and that of said first capacitor.

5. The memory device of claim 4 wherein said capacitance of said first capacitor is approximately twice said capacitance of said second capacitor and said capacitance of said first capacitor is approximately ten times said capacitance of said third capacitor.

6. The memory device of claim 3 wherein said third capacitor is formed by a segment of DEIS material disposed vertically above said floating gate of said dual gate FET between said floating gate and an upper conductive electrode of said third capacitor.

7. The memory device of claim 3 wherein said second gate of said dual gate FET has a first portion overlying an end portion of said floating gate, and a second portion disposed at a position so as to be capable of turning off a channel of said dual gate FET independent of an amount of charge on said floating gate.

8. The memory device of claim 3 wherein portions of said gate of said first FET of said dynamic cell, an upper electrode of said first capacitor, said floating gate of said dual gate FET, an upper electrode of said second capacitor and said second portion of said second gate of said dual gate FET are all separated from an upper surface of a semiconductor substrate upon which said memory device is fabricated by a thin gate oxide layer of substantially uniform thickness.

9. The memory device of claim 8 wherein said gate of said first FET has a second portion overlying an end portion of said upper plate of said first capacitor, and said second portion of said gate of said FET transistor of said dynamic memory cell, said upper plate of said third capacitor, and said first portion of said second gate of said dual gate FET comprise conductive layers disposed a like distance above said surface of said semiconductor substrate.

10. A method for operating said cell of said memory device of claim 3 comprising the steps of:
performing a non-volatile storing operation by driving said second pulsed voltage source positive and negative, the voltage of said second pulsed voltage source when positive being sufficiently great to cause current conduction through said DEIS material to store a positive charge on said floating gate when the data at said data node is at a data 0 and being of sufficient magnitude when negative to cause conduction through said DEIS material to store a negative charge on said floating gate when said data at said data node is at a data 1; and
recovering data stored on said floating gate by writing a data 1 at said data node, driving said third pulsed voltage source positive to turn on a portion of said channel of said dual gate FET under said second gate, whereupon, if said floating gate is charged positively, said first capacitor is discharged through said dual gate FET and if said floating gate is charged negatively, a charge on said first capacitor is retained, and returning said third pulsed voltage source to ground to begin normal dynamic operations of said memory device.

11. The method of claim 10 further comprising the step of, during said data storing operation, periodically refreshing the charge of said first capacitor.

12. The method of claim 11 wherein said refreshing the charge of said first capacitor is performed at a frequency sufficiently great that the data at said data node is not lost during said data storing operation.

13. The method of claim 12 wherein, during said step of driving said second pulsed voltage source positive and negative, the voltage of said second pulsed voltage source is controlled to rise when said second pulsed voltage source is driven positive and to fall when said second pulsed voltage source is driven negative at a rate sufficiently slow as to not change the charge stored on said first capacitor by a magnitude sufficiently great to change the data at said data node.

14. The method of claim 11 wherein, during said step of refreshing said charge on said first capacitor, a refresh voltage is applied thereto of greater magnitude than a refresh voltage used during normal dynamic read/write operations.

* * * * *